(12) United States Patent
Hsu et al.

(10) Patent No.: US 7,666,554 B2
(45) Date of Patent: Feb. 23, 2010

(54) METHOD AND APPARATUS FOR PERFORMING MODEL-BASED LAYOUT CONVERSION FOR USE WITH DIPOLE ILLUMINATION

(75) Inventors: Duan-Fu Stephen Hsu, Freemont, CA (US); Kurt E. Wampler, Sunnyvale, CA (US); Markus Franciscus Antonius Eurlings, Tilburg (NL); Jang Fung Chen, Cupertino, CA (US); Noel Corcoran, San Jose, CA (US)

(73) Assignee: ASML Masktools, B.V. (NL)

( * ) Notice: Subject to any disclaimer, the term of this patent is extended or adjusted under 35 U.S.C. 154(b) by 398 days.

(21) Appl. No.: 11/588,326

(22) Filed: Oct. 27, 2006

(65) Prior Publication Data

US 2007/0042277 A1 Feb. 22, 2007

Related U.S. Application Data

(62) Division of application No. 10/705,231, filed on Nov. 12, 2003, now Pat. No. 7,138,212.

(60) Provisional application No. 60/425,323, filed on Nov. 12, 2002.

(51) Int. Cl.
G03F 1/00 (2006.01)

(52) U.S. Cl. .......................................... 430/5

(58) Field of Classification Search ............. 430/5, 430/311, 312, 313, 394; 716/19, 20, 21
See application file for complete search history.

(56) References Cited

U.S. PATENT DOCUMENTS 5,546,225 A 8/1996 Shiraishi
6,553,562 B2 4/2003 Capodieci et al.

(Continued)

FOREIGN PATENT DOCUMENTS

EP 1308780 5/2003
JP 9-288345 11/1997
JP 11-102062 4/1999

OTHER PUBLICATIONS

Austrian Search Report and Written Opinion issued in corresponding Singapore Patent Application No. 200306762-6, dated Sep. 22, 2006.

(Continued)

*Primary Examiner*—Stephen Rosasco
(74) *Attorney, Agent, or Firm*—Pillsbury Winthrop Shaw Pittman LLP

(57) ABSTRACT

A method of generating complementary masks for use in a multiple-exposure lithographic imaging process. The method includes the steps of: identifying a target pattern having a plurality of features comprising horizontal and vertical edges; generating a horizontal mask based on the target pattern; generating a vertical mask based on the target pattern; performing a shielding step in which at least one of the vertical edges of the plurality of features in the target pattern is replaced by a shield in the horizontal mask, and in which at least one of the horizontal edges of the plurality of features in the target pattern is replaced by a shield in the vertical mask, where the shields have a width which is greater that the width of the corresponding feature in the target pattern; performing an assist feature placement step in which sub-resolution assist features are disposed parallel to at least one of the horizontal edges of the plurality of features in the horizontal mask, and are disposed parallel to at least one of the vertical edges of the plurality of features in the vertical mask, and performing a feature biasing step in which at least one of the horizontal edges of the plurality of features in the horizontal mask are adjusted such that the resulting feature accurately reproduces the target pattern, and at least one of the vertical edges of the plurality of features in the vertical mask are adjusted such that the resulting feature accurately reproduces the target pattern.

18 Claims, 12 Drawing Sheets

U.S. PATENT DOCUMENTS

| | | | |
|---|---|---|---|
| 6,665,858 | B2 | 12/2003 | Miyazaki |
| 6,792,591 | B2 | 9/2004 | Shi et al. |
| 6,807,662 | B2 | 10/2004 | Toublan et al. |
| 6,851,103 | B2 | 2/2005 | Van Den Broeke et al. |
| 6,855,486 | B1 | 2/2005 | Finders et al. |
| 6,875,545 | B2 | 4/2005 | Eurlings |
| 6,915,505 | B2 | 7/2005 | Hsu et al. |
| 7,013,439 | B2 * | 3/2006 | Robles et al. .................. 716/4 |
| 7,138,212 | B2 * | 11/2006 | Hsu et al. .................... 430/5 |
| 7,246,342 | B2 | 7/2007 | Hsu et al. |
| 2002/0166107 | A1 | 11/2002 | Capodieci et al. |
| 2003/0082463 | A1 | 5/2003 | Laidig et al. |
| 2003/0177467 | A1 | 9/2003 | Ohnuma et al. ............... 716/19 |
| 2004/0003368 | A1 | 1/2004 | Hsu et al. |
| 2004/0005089 | A1 | 1/2004 | Robles et al. |
| 2004/0139418 | A1 | 7/2004 | Shi et al. |
| 2005/0102648 | A1 | 5/2005 | Hsu et al. |

OTHER PUBLICATIONS

Eurlings et al., "0.11 μm imaging in KrF lithography using dipole illumination", Proceedings of SPIE, vol. 4404 (2001) pp. 266-278.

Hsu et al., "65 nm Full-Chip Implementation Using Double Dipole Lithography", Proceedings of SPIE, Bellingham, VA, vol. 5040, No. 1, Feb. 25, 2003, pp. 215-231, XP 009024366.

Hsu et al., "Dipole decomposition mask design for full-chip implementation at 100nm technology node and beyond", Proceedings of The SPIE, Bellingham, VA, vol. 4691, Mar. 5, 2002, pp. 476-490, XP 002261072.

Torres et al., "Model-assisted double dipole decomposition", Proceedings of The SPIE, Bellingham, VA, vol. 4691, Mar. 5, 2002, pp. 407-417, XP 002257323.

Torres et al., "Alternatives to alternating phase shift masks for 65nm" Proceedings of The SPIE—The International Society for Optical Engineering SPIE-INT. Soc. Opt. Eng, vol. 4889, Oct. 1, 2002, pp. 540-550, XP002320776.

Nam, "Patterning 220nm Pitch DRAM Patterns by Using Double Mask Exposure", Proceedings of SPIE, vol. 4000, (Mar. 2000), pp. 283-292.

Finders et al., "Can DUV take us below 100nm?" Proceedings of SPIE, vol. 4346, (2000), pp. 153-165.

Kim et al., "Feasibility Study of Printing Sub 100 nm with ArF Lithography", Proceedings of SPIE, vol. 4346, (2000), pp. 214-221.

* cited by examiner

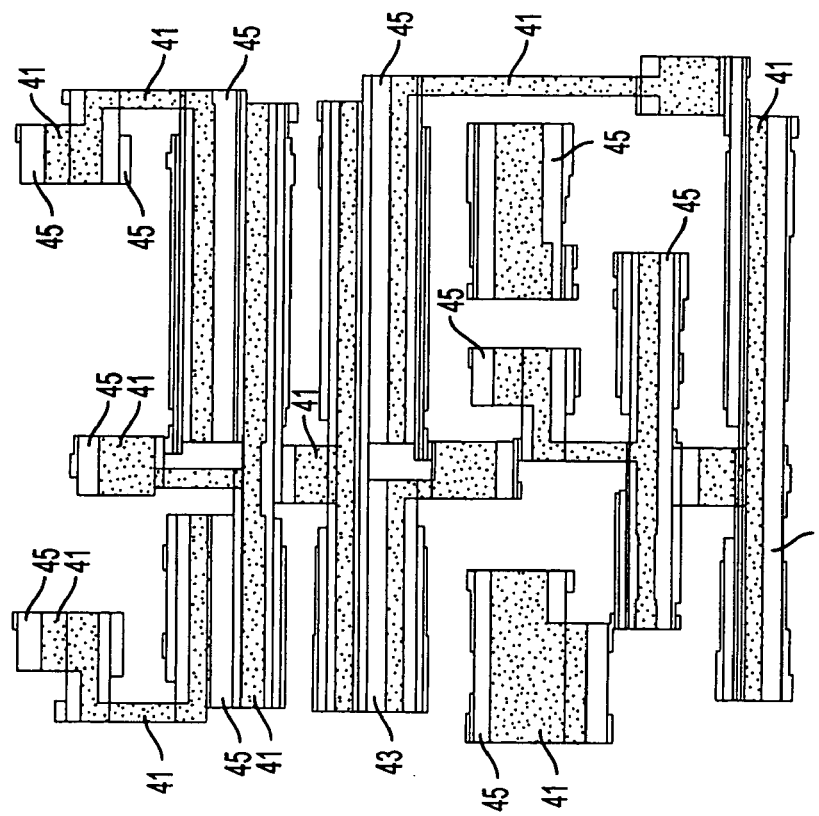
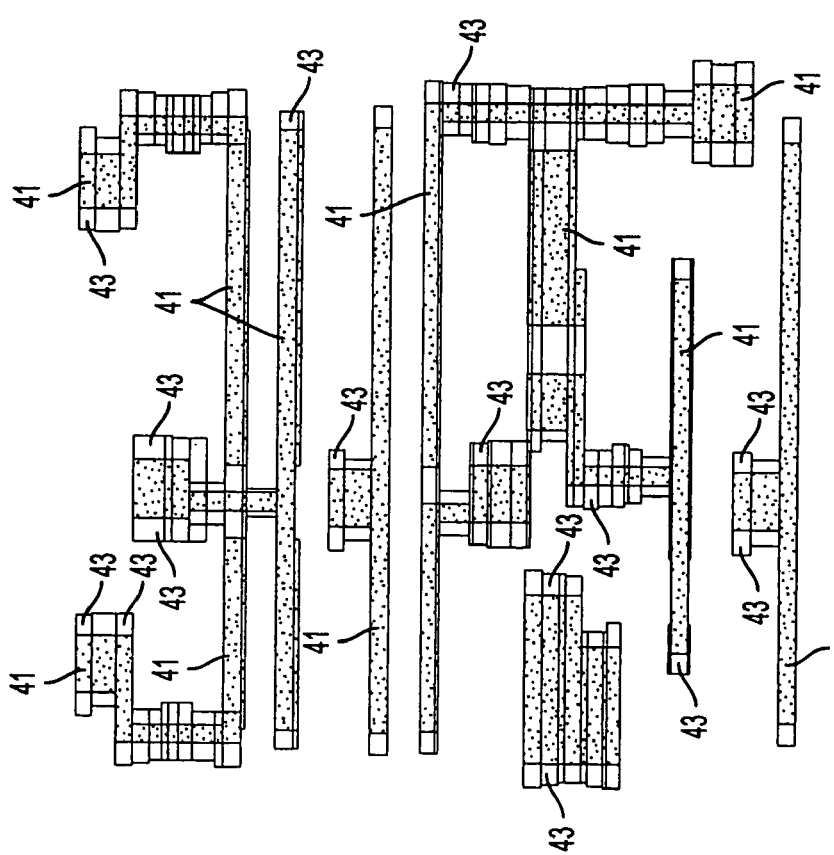

| LAYOUT CONVERSION & OPC METHOD | RULE-BASED (EXISTING) | FULL MODEL METHOD |
|---|---|---|
| TREATMENT STEPS | 4 TREATMENTS | 3 TREATMENTS |
| JOG | SENSITIVE TO JOG | NOT SENSITIVE TO JOG |
| 2D CORNER | NEGATIVE SERIF (WD/DP) | N/A |
| GATE SHRINK | READY | READY |
| DEVICE TYPE | MEMORY AND LOGIC NEED TO BE TREATED IN TWO PASSES | MEMORY AND LOGIC CAN BE HANDLE IN ONE PASS |

FIG. 13

METHOD AND APPARATUS FOR PERFORMING MODEL-BASED LAYOUT CONVERSION FOR USE WITH DIPOLE ILLUMINATION

This application is a divisional of application Ser. No. 10/705,231, filed Nov. 12, 2003, now U.S. Pat. No. 7,332,250, which claims priority of U.S. Provisional Application Ser. No. 60/425,323, filed Nov. 12, 2002, the contents of which are herewith incorporated by reference.

FIELD OF THE INVENTION

The present invention relates to photolithography, and in particular relates to the generation of mask layouts for use with double dipole illumination techniques that utilizes a model-based conversion process for generating the horizontal and vertical mask layouts associated with dipole illumination. In addition, the present invention relates to a device manufacturing method using a lithographic apparatus comprising a radiation system for providing a projection beam of radiation; a mask table for holding a reticle, serving to pattern the projection beam; a substrate table for holding a substrate; and a projection system for projecting the patterned projection beam onto a target portion of the substrate.

BACKGROUND OF THE INVENTION

Lithographic projection apparatus (tools) can be used, for example, in the manufacture of integrated circuits (ICs). In such a case, the mask contains a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing. Thereafter, the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

The lithographic tool may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic tools are described, for example, in U.S. Pat. No. 5,969,441 and WO 98/40791, incorporated herein by reference.

The photolithography masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD (critical dimension) of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

Furthermore, as the demand continues for even higher performance of semiconductor devices, the design rule shrink rate is outpacing the progress of both of the exposure wavelength reduction and the advancement of high Numerical Aperture (NA) lenses. This factor has presented a challenge to lithographers to push optical lithography beyond the limit that was thought possible a few years ago. As is known, Resolution Enhancement Techniques (RETs) have become indispensable in low $k_1$ optical lithography. Strong Off-Axis Illumination (OAI), which uses 2-beam imaging with symmetrical $0^{th}$ and $1^{st}$ orders in the lens pupil, can greatly enhance resolution and contrast. Dipole illumination is the most extreme case of OAI, and is capable of providing better imaging contrast with improved process latitude for very low $k_1$ imaging.

However, one of the limitations associated with dipole illumination is that a single illumination only enhances resolution for features that are orthogonal to the illumination pole axis. As a result, in order to take full advantage of dipole illumination during wafer printing, the mask pattern must be converted into horizontal and vertical orientations. Once the mask pattern is converted in this manner, a Y-pole exposure is utilized to image the horizontally oriented features, and a X-pole exposure is utilized to image the vertically oriented features. One important aspect of dipole illumination is that when imaging the horizontally oriented features, the vertically oriented features must be protected (i.e., shielded) so the vertically oriented features are not degraded. The opposite is true when vertically oriented features are imaged (i.e., the horizontally oriented features must be protected).

FIG. 1 illustrates the basic concepts of double dipole imaging. As stated, typically there are at least two exposures when utilizing dipole illumination. In the first exposure, the X dipole aperture 10 provides a maximum aerial image intensity (i.e., maximum modulation) for the vertical portion of the lines 12 to be printed. The resulting image profile is illustrated by line 24 in FIG. 1. In the second exposure, which utilizes the Y-dipole aperture 16, there is no image modulation for lines 12. It is noted, however, that during the second exposure using the Y-dipole aperture, the vertical portions of the lines 12 need to be shielded so that the vertical features formed during the first exposure are not degraded during the second exposure. FIG. 1 illustrates shielding the lines 12 with shields 15, each of which is formed by enlarging the target line 12 in the horizontal direction 20 nm per side. It is noted that the amount of shielding corresponds to the amount that the vertical edges of the feature are extended. For example, assuming an initial line width of 70 nm, each vertical edge would be extended an additional 20 nm, which would result in a total width of shield 15 of 110 nm. As a result of the shielding, when exposing the horizontal lines using the Y dipole aperture, there is substantially no imaging (i.e., modulation) of the vertical features 12. The aerial image is a DC component as shown by line 17 in FIG. 1, which corresponds to the 20 nm shielding. The final aerial image intensity, which is represented by line 14 in FIG. 1, corresponds to the sum of the first exposure using the X dipole aperture and the second exposure using the Y dipole aperture.

It is further noted that, assuming the exposure energy is constant, increasing the width of the shielding of each edge from a 20 nm shield 15 to a 40 nm shield 20 for the vertical lines 12 causes the minimal intensity level of the resulting image to shift to a lower level. This is represented by line 22 in FIG. 1, which represents the aerial image associated with the vertical portions of the features. As shown, the aerial image 22 is just a DC component. However, it is lower than the DC component 17 associated with the 20 nm shield. As a result, the composite image 19 formed utilizing the 40 nm shielding provides better imaging results than the composite image 14 formed utilizing the 20 nm shielding.

When utilizing dipole illumination techniques, as a result of the need to separate the horizontally and vertically oriented features, one of the challenges for the lithographer is determining how to convert the original IC design data into its horizontal or vertical pattern components and generate two masks for the dual exposure process that can take full advantage of the dipole imaging performance.

FIG. 2 is a flowchart which depicts an exemplary rule-based decomposition process for generating the horizontal and vertical masks based on a target design. Referring to FIG. 2, the first step (Step 200) is to decompose or separate the original layout 19 (i.e., target design) into primarily horizontal features and vertical features. The next step (Step 220) is to apply shielding to both masks, using rule-based edge treatment. Typically, the shielding rules are empirical determined (e.g., the rules are defined using experimental results at a given number of pitch intervals). The third step (Step 240) is to apply scattering bars (i.e., OPC technique) to both dipole masks (horizontal and vertical). Specifically, after the shielding has been applied in the first step, scattering bar OPC is then applied to each of the orientations. The scattering bars (SB) are applied only along the orientations perpendicular to the pole (i.e., vertical SBs on the vertical mask and horizontal SBs on the horizontal mask). The fourth step (Step 260) is to provide negative serif treatment (also known as widen/deepen) to concave corners. The purpose is to provide cuts-outs in the shielding, near concave corners, which allow enough light to define the edges along the high modulation orientation, causing better line-definition in the concave corners. The final step (Step 280) in this approach is to apply fine biasing along the critical high modulation orientations for each mask. The horizontal mask will have fine biasing treatment along the horizontal edges and the vertical mask will have the fine biasing along the vertical edges.

Currently known techniques for generating the horizontal and vertical masks do not always produce optimal results when attempting to generate such masks for complex structures. For example, utilizing known techniques such as the one disclosed in the flowchart of FIG. 2, it is sometimes difficult, for example, to provide proper shielding for complex structures, such as, "jogs" (i.e., short changes in either the vertical or horizontal direction, for example, a short vertical step, between two long horizontal lines), short "S" turns and/or U-shaped patterns in the design. Moreover, it is sometimes difficult to determine whether or not a given structure of the target design should be treated as a horizontal structure or a vertical structure when initially generating the horizontal and vertical masks. As a result, it was often necessary to have an experienced mask designer involved with the generation of the horizontal and vertical masks for addressing and rectifying the foregoing issues in order to generate acceptable mask designs.

Accordingly, there exists a need for a method which allows for the generation of both horizontal and vertical masks utilized in conjunction with double dipole imaging, which eliminates the issues and disadvantages associated with prior art techniques for generating horizontal and vertical masks.

SUMMARY OF THE INVENTION

In an effort to solve the foregoing needs, it is one object of the present invention to provide a method for generating the horizontal and vertical masks for performing dipole illumination which simplifies the layout conversion process relative to the prior art techniques and allows for a more straight-forward design approach.

More specifically, the present invention relates to a method of generating complementary masks for use in a multiple-exposure lithographic imaging process. The method includes the steps of: identifying a target pattern having a plurality of features comprising horizontal and vertical edges; generating a horizontal mask based on the target pattern; generating a vertical mask based on the target pattern; performing a shielding step in which at least one of the vertical edges of the plurality of features in the target pattern is replaced by a shield in the horizontal mask, and in which at least one of the horizontal edges of the plurality of features in the target pattern is replaced by a shield in the vertical mask, where the shields have a width which is greater that the width of the corresponding feature in the target pattern; performing an assist feature placement step in which sub-resolution assist features are disposed parallel to at least one of the horizontal edges of the plurality of features in the horizontal mask, and are disposed parallel to at least one of the vertical edges of the plurality of features in the vertical mask, and performing a feature biasing step in which at least one of the horizontal edges of the plurality of features in the horizontal mask are adjusted such that the resulting feature accurately reproduces the target pattern, and at least one of the vertical edges of the plurality of features in the vertical mask are adjusted such that the resulting feature accurately reproduces the target pattern.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a) A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

b) A programmable LCD array. An example of such a construction is given in U.S. Pat. No. 5,229,872, which is incorporated herein by reference.

The method of the present invention provides important advantages over the prior art. Most importantly, instead of using a complicated hand-crafted rule-based decomposition flow, the method of the present invention allows for a simplified model-based procedure for generating the horizontal and vertical masks from the target design.

Further, the method of the present invention not only simplifies the processing flow, but it also helps to eliminate several significant problems associated with known techniques. For example, in comparison to the present invention, the known rule-based method illustrated in FIG. 2 requires the generation of a dedicated rule for each and every kind of feature to be printed. Thus, for any practical design, the set of rules that must be generated is prohibitively large. In contrast, with the method of the present invention, there is no need to build a library of rules. The table illustrated in FIG. 13 lists some of the differences between the method of the present invention and the known rule-based method.

In addition, the model-based approach of the present invention also provides shielding treatment, which more effectively handles difficult structures, such as, jogs, S-turns and U-turns. Further, the method of the present invention is capable of simultaneously converting complex logic and memory mask patterns in double dipole lithography (DDL) compatible mask layouts.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

BRIEF DESCRIPTION OF THE DRAWINGS

FIGS. 4a and 4b illustrate the horizontal mask and vertical mask, respectively, after shielding has been applied in accordance with the method of the present invention.

FIG. 13 illustrates a table illustrating exemplary differences between the method of the present invention and the known rule-based method.

DETAILED DESCRIPTION OF THE INVENTION

As explained in more detail below, the preferred embodiment of the present invention provides a method and apparatus for generating horizontal and vertical masks for use with dipole illumination. Specifically, the method of the present invention relates to a model-based layout-conversion method for generating the horizontal and vertical masks from a target design.

Figure 1:
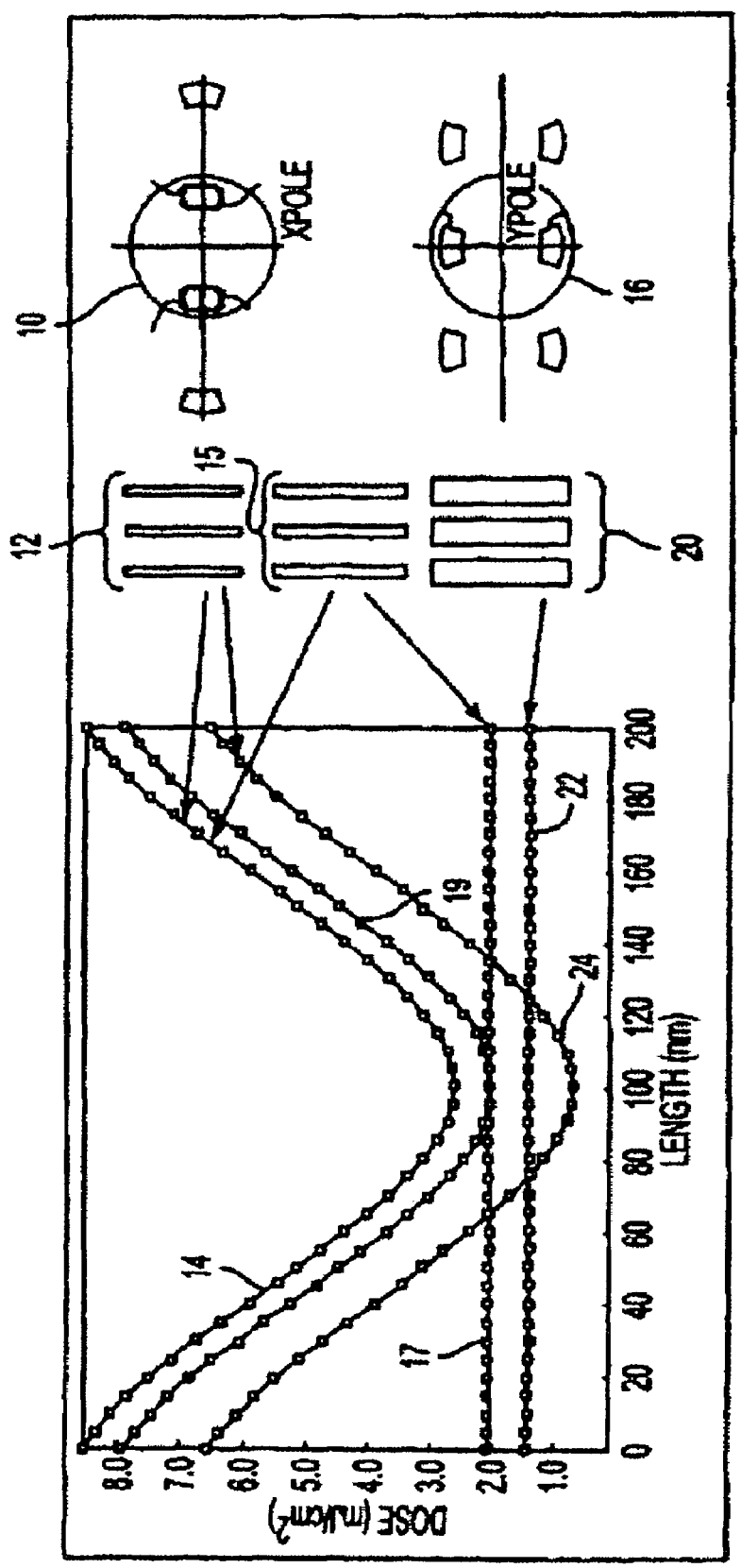
FIG. 1 illustrates the principles of dipole illumination.
Figure 3:
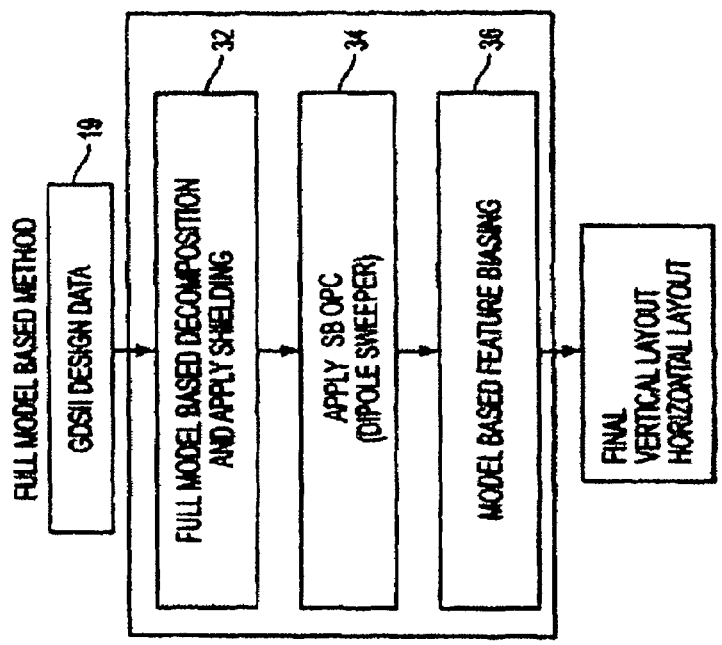
FIG. 3 is an exemplary flowchart illustrating the model-based layout-conversion method of the present invention.

FIG. 3 is an exemplary flowchart illustrating the model-based layout-conversion method of the present invention. As is shown in FIG. 3, the model-based approach entails essentially 3 basic processing steps.

Referring to FIG. 3, the first step (Step 32) of the model-based approach comprises applying shielding utilizing a model-based OPC to the vertical edges in the target pattern so as to define the horizontal mask, and applying shielding to the horizontal edges in the target pattern so as to define the vertical mask. In other words, the starting point for both the horizontal mask and the vertical mask is the target design. It is noted that the target design data can be made available in GDSII data format 19, or any other suitable format. Then, in the horizontal mask, the vertical edges in the target design have shielding applied thereto, and in the vertical mask, the horizontal edges in the target design have shielding applied thereto. As explained further below, the amount of shielding to be applied is determined utilizing the OPC model (based on for example, an aerial image or an empirical model). It is also noted that the OPC model could also be based on a theoretical model to determine the shielding amounts to be applied to the target pattern. It is noted that as explained further below, it is possible that not all of the vertical and horizontal edges will have shielding applied thereto, and the amount of shielding applied may also vary.

In accordance with the present invention, an OPC model, which is represented as a function, that defines the imaging performance of imaging system (i.e., the imaging tool, the imaging conditions, the resist, the resist processing, etc.) is generated. Once this function, which is referred to as a system pseudo intensity function (SPIF), is generated, it can be utilized to automatically adjust/revise the target pattern to be imaged such that the printed image matches the target pattern (within some defined error margin). In other words, it is this SPIF function which is utilized to automatically define the necessary shielding applied to the horizontal and vertical masks to reproduce the desired target.

The generation of SPIF functions has been described, for example, in U.S. patent application Ser. No. 10/266,922, which is hereby incorporated by reference. A brief description of the process is provided. The first step is to determine a set of performance parameters which define the printing performance of the given imaging system. Next, in one embodiment, actual images are compared to predicted images for multiple types of features (e.g., densely-spaced features, semi-isolated features, isolated features, line-ends, elbows, etc.) to determine how far the printed image (i.e., actual image) deviates from the predicted image. Then, the performance parameters, defining the printing process, are adjusted such that the predicted image matches the actual image printed on the wafer. At this point, the SPIF function with the associated performance parameters accurately represents the imaging performance of the given imaging process. An example of a SPIF is as follows:

$$SPIF(x, y) = \sum_{i=1}^{n} \alpha_i |M(x, y) * \Psi_i(x, y)|^2$$

where,
$\alpha_i$, is a weighting coefficient to be calibrated and optimized;
$M(x,y)$ is the mask transmission function;
$\Psi_i(x,y)$ is the set of basis functions that have been chosen to represent optical imaging system, e.g., the Eigen functions of a theoretical optical-system;
x,y are the location of wafer pattern; and
* is the convolution operator.

By utilizing the SPIF to predict how a given design pattern would print, it is possible to optimize the reticle design to print the desired ("target") pattern. For this type of optimization process, one can use any well-established optimization method, for example, such as Levenberg-Marquardt. In other words, the SPIF can be utilized to define how features in the target pattern should be modified in the reticle to obtain the target pattern in the imaged substrate.

Figure 6:
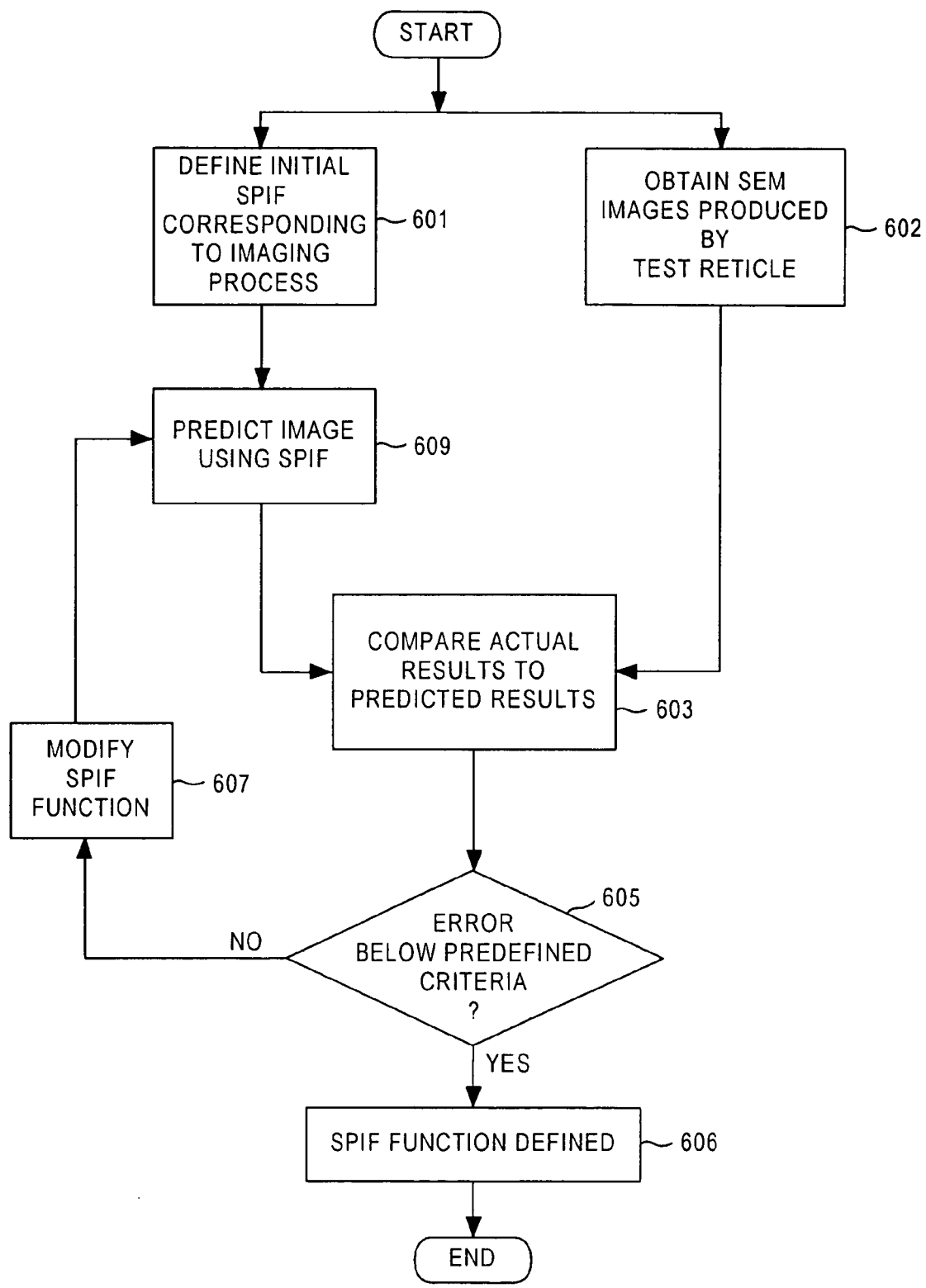
FIG. 6 illustrates an exemplary flowchart illustrating the process of generating a SPIF utilized in the model-based OPC method of the present invention.

FIG. 6 illustrates an exemplary flowchart illustrates the foregoing process of generating a SPIF utilized in the model-based OPC method of the present invention. In the first step, Step 601, an initial SPIF function representing the imaging process is defined. In the next step, Step 602, SEM images of actual test patterns imaged on substrates are taken. In the given embodiment, the test patterns are imaged utilizing double dipole imaging so as to accurately reflect the resulting pattern after illumination utilizing a vertical dipole and a horizontal dipole. In Step 609, the SPIF function is initially evaluated utilizing the test patterns to generated a predicted pattern Next, Step, 603, the predicted image obtained by utilizing the SPIF function is compared to the actual printed test patterns to determine the difference between the two results. If the difference is below some predefined error criteria, Step 605, the SPIF function is acceptable, and is utilized to define printing performance, Step 606. However, if the difference is not below the predefined error criteria, the variables in the SPIF function are varied, Step 607, and a new predicted pattern based on the modified SPIF function is computed, Step 609. The new predicted pattern is then compared to the actual printed test patterns in the same manner as set forth above. This process continues until the SPIF function produces a predicted pattern which matches the actual printed pattern within the predefined error criteria. It is noted that in the preferred embodiment, a two dimensional contour of the printed test pattern is taken utilizing the SEM.

As noted above, once the SPIF function is generated, it can be utilized to determine the amount of shielding to be applied to the edges of the horizontal and vertical features in the vertical and horizontal masks, respectively. In other words, the SPIF function is utilized to automatically determine whether or not shielding is required to be applied to a given feature edge, as well as the amount of shielding required so that the target pattern is accurately reproduced in the imaged substrate.

FIGS. 4a and 4b illustrate the process associated with Step 32. FIG. 4a illustrates the horizontal mask after shielding has been applied as defined by the SPIF function. As shown, the vertical edges in the target pattern (indicated by the solid lines 41) has shielding 43 applied thereto. As noted, this shielding 43 is necessary for protecting the vertical edges of the target pattern when imaging the horizontal edges of the target pattern. Similarly, FIG. 4b illustrates the vertical mask after shielding has been applied. As shown, the horizontal edges in the target pattern (indicated by the solid lines 41) has shielding 45 applied thereto. Again, this shielding 45 is necessary for protecting the horizontal edges of the target pattern when imaging the vertical edges of the target pattern. As noted, it is possible that not every horizontal edge or vertical edge in the respective masks will have shielding applied thereto. Shielding is applied only where deemed necessary by the OPC model (i.e., SPIF function).

Thus, in accordance with the current method, the calibrated model, which corresponds to the SPIF function, defines all shielding edge treatment to be applied to the target design in both the horizontal and vertical masks. The output of Step 32 is horizontal and vertical masks with optimal shielding as applied by the model. It is noted that in contrast to the prior art methods discussed above, when practicing the model based method disclosed herein, there is no need to perform the step of separating the original design into horizontal and vertical features (which can be a difficult task). Nor is there a need for generating specific rules for treating each of the possible features that could be encountered in a practical design. As noted, in Step 32 shielding is applied on the basis of the edges orientation (i.e., vertical edges are shielded in the horizontal mask, and horizontal edges are shielded in the vertical mask) in accordance with the SPIF function.

Figure 4D:
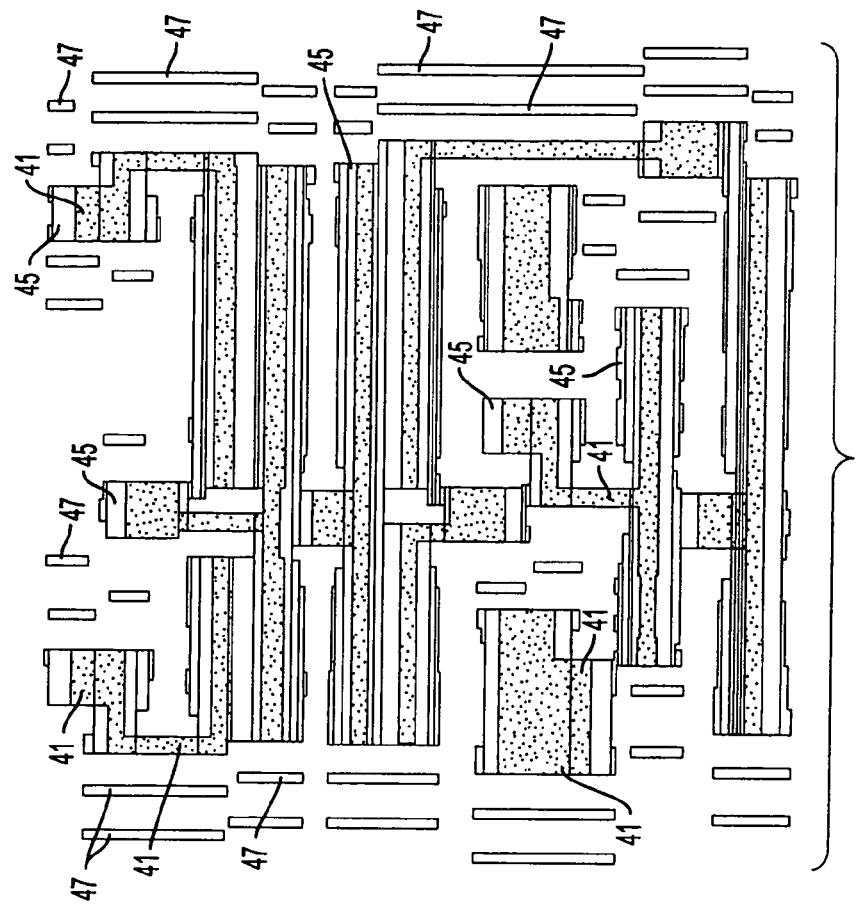
FIGS. 4c and 4d illustrate the horizontal mask and vertical mask, respectively, after scatter bars have been applied in accordance with the method of the present invention.
Figure 4C:
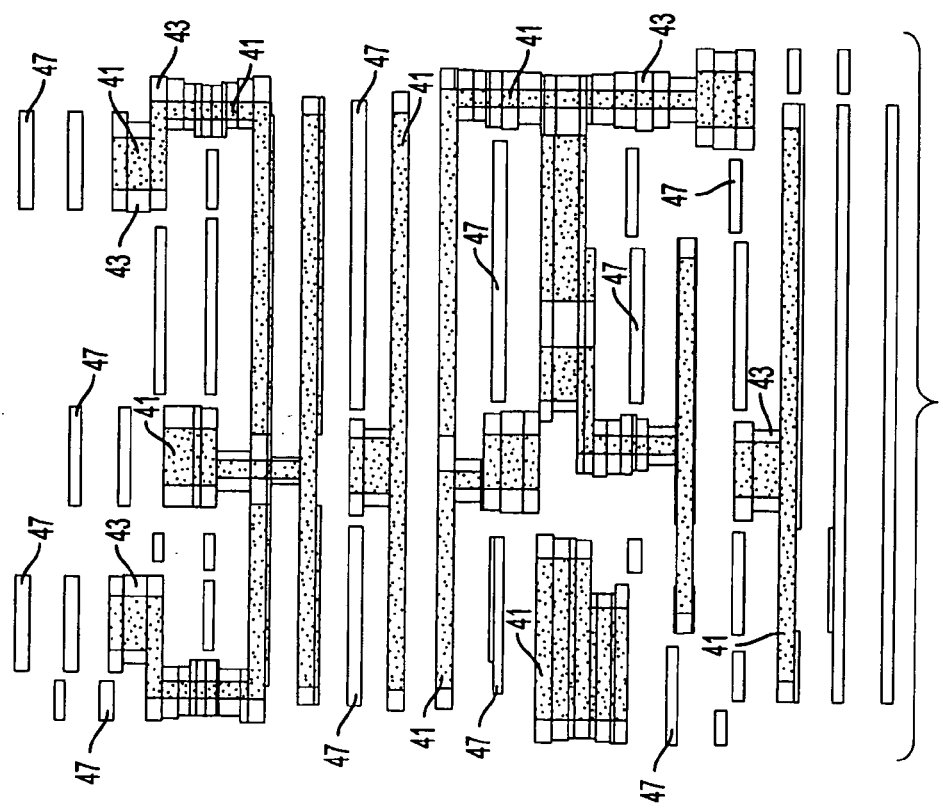

The next step in the process (Step 34) entails the application of sub-resolution scatter bars or assist features to the horizontal and vertical masks. The result of Step 34 is illustrated in FIGS. 4c and 4d. More specifically, referring to FIG. 4c, which illustrates the horizontal mask, the scatter bars 47 are only disposed adjacent the horizontal edges to be imaged. Similarly, referring to FIG. 4d, which illustrates the horizontal mask, the scatter bars 47 are only disposed adjacent the vertical edges to be imaged. The use of such sub-resolution scatter bars and assist features to provide OPC is well known by those of skill in the art and is taught for example, in U.S. Pat. No. 5,821,014, which is hereby incorporated by reference. Accordingly, additional disclosure regarding scatter bars is omitted.

Figure 4F:
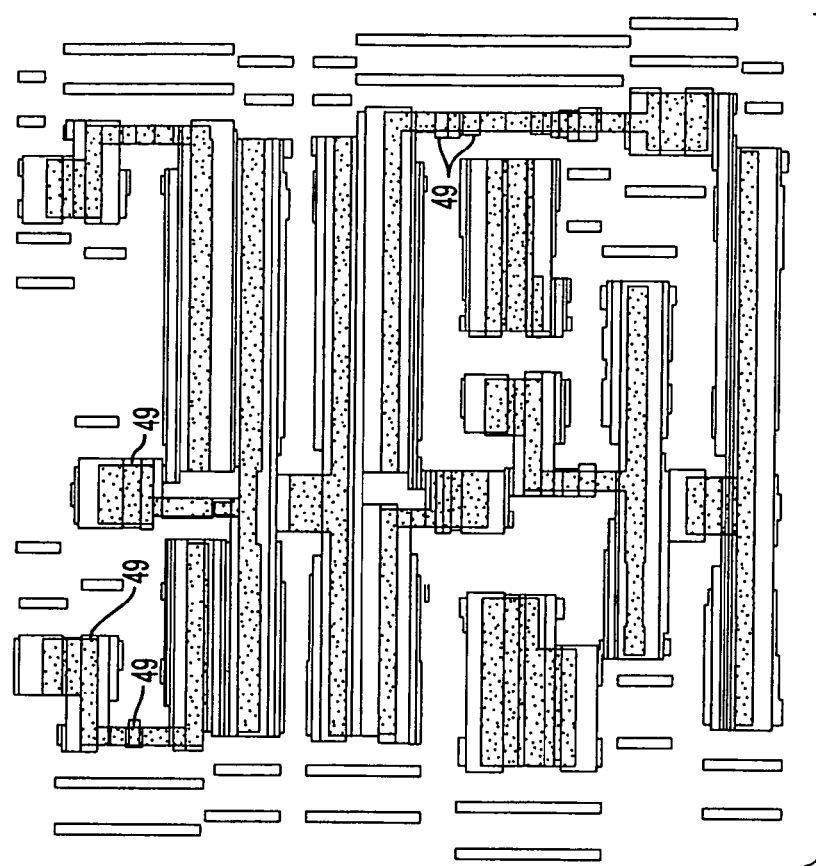
FIGS. 4e and 4f illustrate the horizontal mask and vertical mask, respectively, after fine feature biasing has been performed in accordance with the method of the present invention.
Figure 4E:
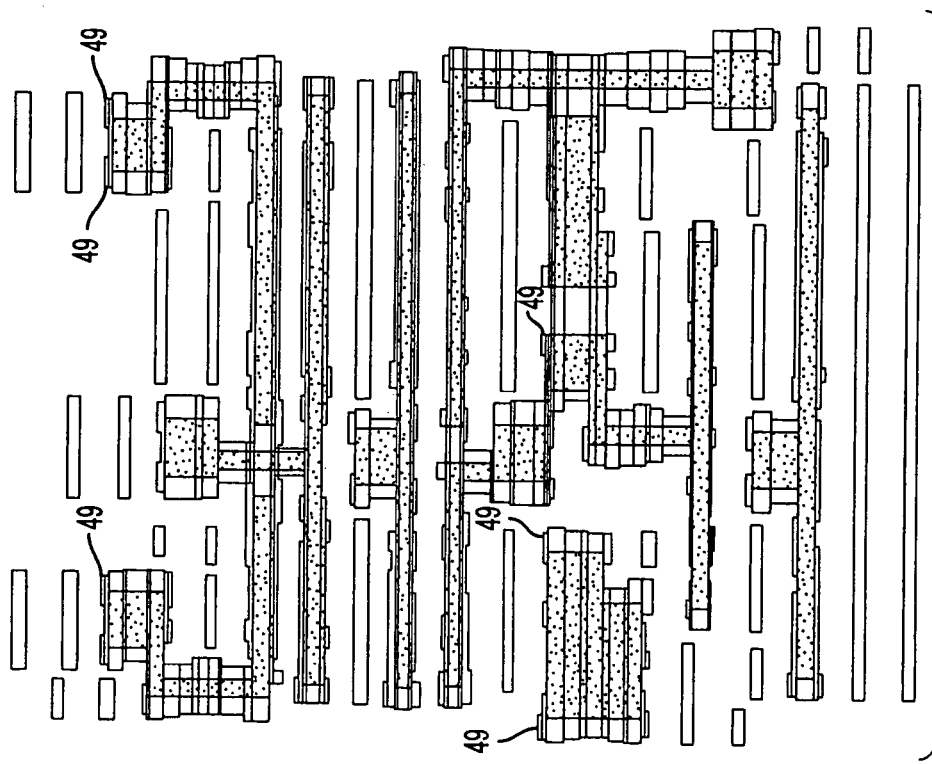

The third and final step in the process (Step 36) entails applying fine biasing along the critical high modulation orientations for both the horizontal and vertical masks. More specifically, fine biasing 49 is applied along the horizontal edges in the horizontal mask, and fine biasing is applied to the vertical edges in the vertical mask. FIG. 4(e) illustrates an example of the resulting horizontal mask after application of fine biasing of the horizontal edges to be imaged, and FIG. 4(f) illustrates an example of the resulting vertical mask after application of fine biasing of the vertical edges to be imaged. It is noted that the fine biasing is automatically performed based on the model so as to provide an additional level of OPC. Referring to FIGS. 4e and 4f, it is shown that the edges to be imaged in the given horizontal and vertical masks are modified from the straight edges illustrated in the corresponding horizontal and vertical masks illustrated in FIGS. 4c and 4d, respectively. As an example, the model may provide, for example, automatically defining the in-cut amount (i.e., deepen amount) in the negative serif area so as to accurately define all edges, or adjustment of the feature edges to provide for CD control. Once the fine biasing step has been performed, the process of generating the horizontal and vertical masks is complete, and the masks can be utilized to image the wafer.

Figure 5B:
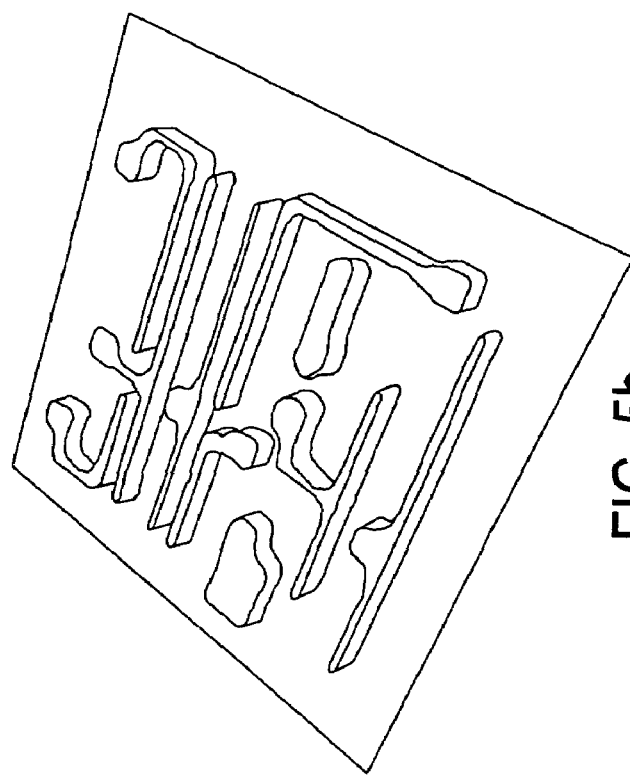
FIG. 5b illustrates the corresponding 3D profile.
Figure 5A:
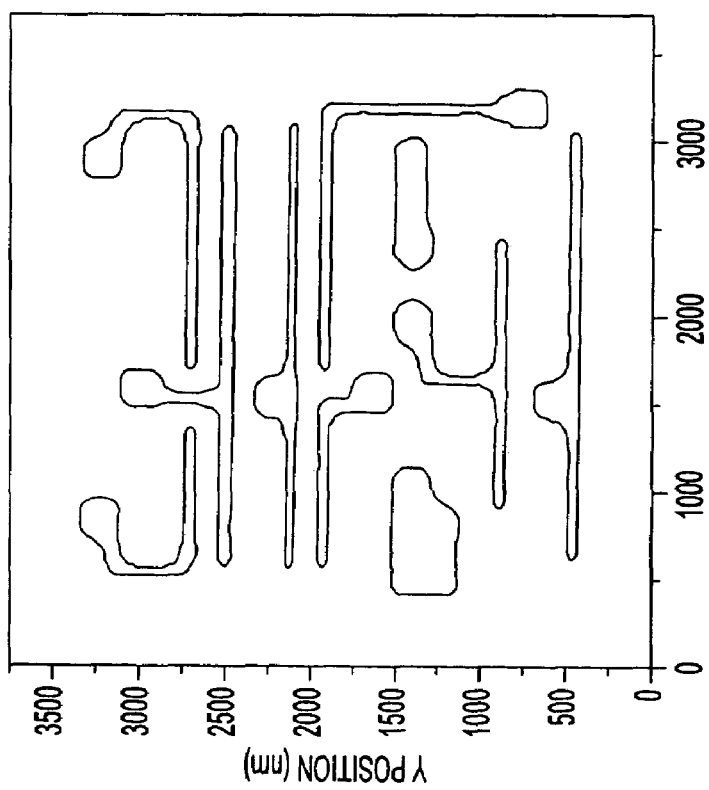
FIG. 5a illustrates a calculated resist contour with double exposure using the model-based generated mask layouts illustrated in FIGS. 4e and 4f.

FIG. 5a illustrates the calculated/predicted full resist contour with double exposure using the full model-based generated mask layouts illustrated in FIGS. 4e and 4f, and FIG. 5b illustrates the corresponding 3D profile.

Figures 7A, 7B:
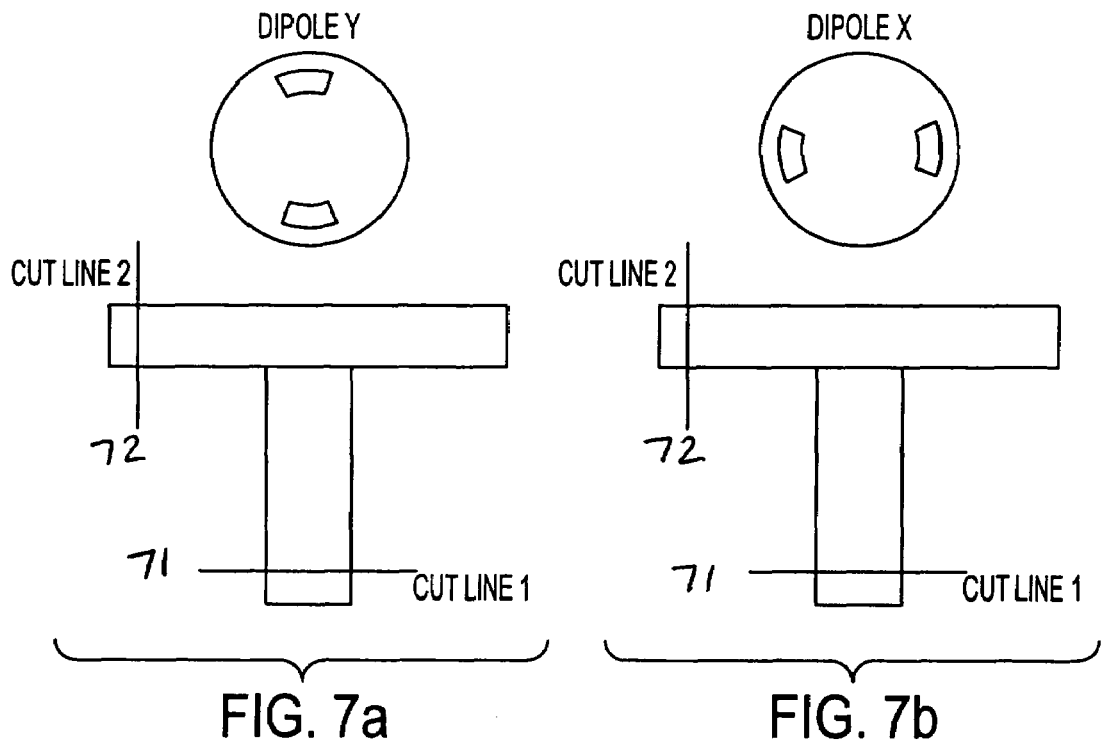
FIGS. 7a and 7b illustrate an exemplary horizontal mask and an exemplary vertical mask prior to performing the shielding step of the present invention.

As noted above, the model based OPC utilized in conjunction with the present invention is determined based on, for example, an aerial image or an empirical model, or alternatively, a theoretical model. A more detailed example of the application of the model based OPC for providing the shielding required for double-dipole lithography techniques is set forth below. FIGS. 7a and 7b illustrate an exemplary target pattern, which is a "T" shaped feature. FIG. 7a illustrates the horizontal mask (to be imaged utilizing the Y-dipole) and FIG. 7b illustrates the vertical mask (to by imaged utilizing the X-dipole). Initially, both the horizontal mask and the vertical mask are identical to the target mask. Then, as explained herein, the shielding is adjusted by the model OPC rule such that the target pattern is accurately reproduced within acceptable limits.

Figures 8A, 8B:
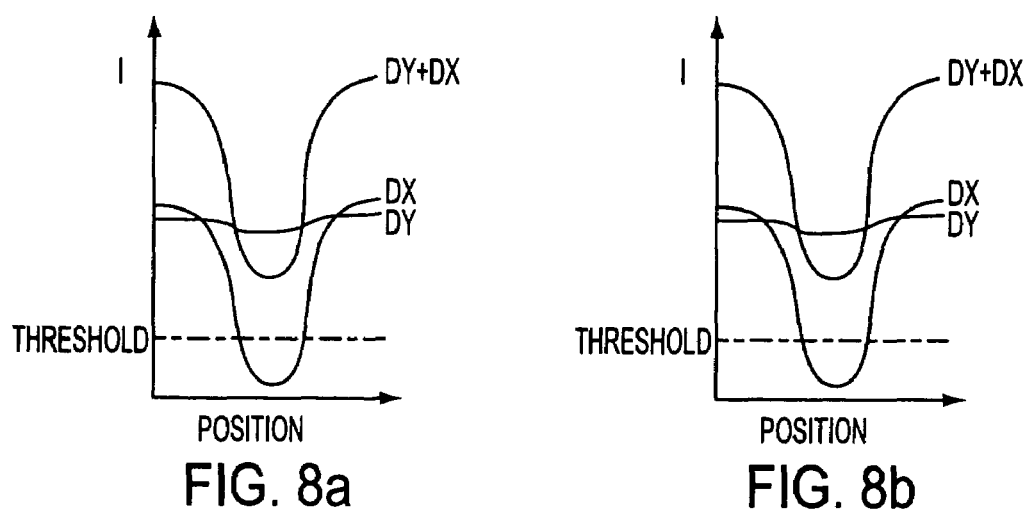
FIGS. 8a and 8b illustrate exemplary intensity distributions corresponding to the masks illustrated in FIGS. 7a and 7b.

Referring to FIGS. 7a and 7b, in order to illustrate this process, cut lines 71 and 72 are defined at which the intensity distribution can be examined. The first cut line 71 is taken across a vertical feature, and the second cut line 72 is taken across a horizontal feature. An exemplary intensity distribution at cut line 71 is illustrated in FIG. 8a and an exemplary intensity distribution at cut line 72 is illustrated in FIG. 8b. It is noted that the location of the cut lines and the intensity distributions are merely exemplary. Further, the intensity distributions illustrated in FIGS. 8a, 8b, 10a, 10b, 12a and 12b are for illustration purposes only and are not intended to represent or correspond to actual intensity distributions.

Figures 9A, 9B:
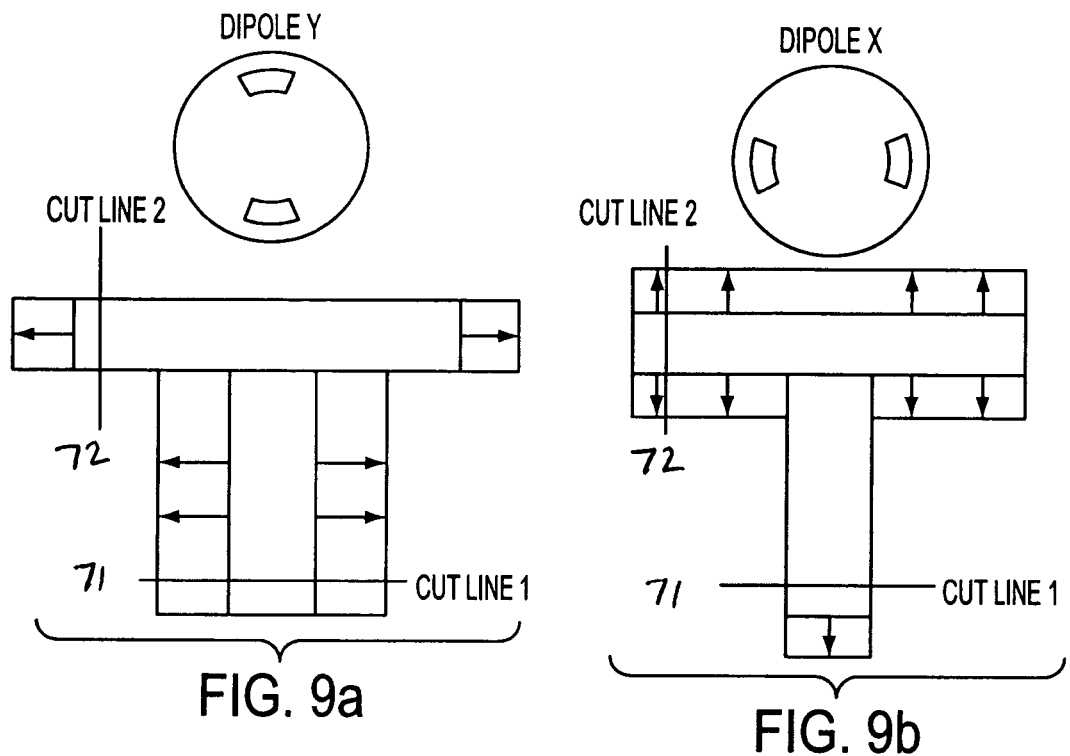
FIGS. 9a and 9b illustrate the horizontal mask and the vertical mask after the shielding step is performed.
Figures 10A, 10B:
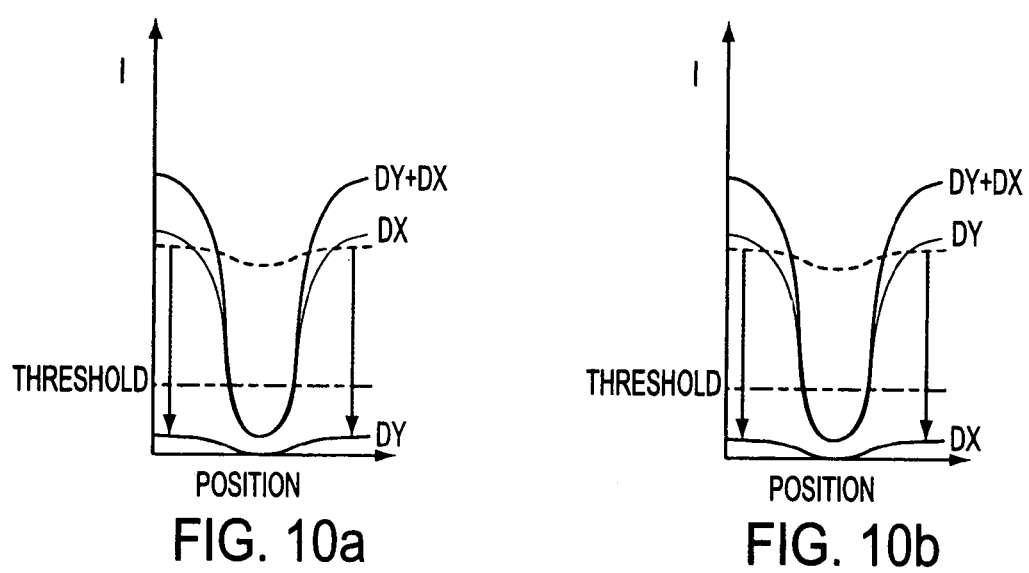
FIGS. 10a and 10b illustrate exemplary intensity distributions corresponding to the masks illustrated in FIGS. 9a and 9b.

Referring to FIGS. 8a and 8b, the intensity distribution following an illumination with a dipole X is labelled DX, and the intensity distribution following an illumination with a dipole Y is labelled DY. The difference between the intensity distribution of FIG. 8a and the intensity distribution of FIG. 8b is the shape of the intensity distribution following from a DX or a DY illumination. The threshold provides the intensity at which the resist develops. As shown in the given example, the sum of the two exposures lies above the threshold for both cut lines. Thus, in this situation, if the masks corresponded to the original target pattern, no feature will be printed at all. In order to lower the intensity distribution, the edges of the target feature are biased outwards (i.e., shielding) in accordance with the shielding requirements defined by the model OPC rule. In accordance with the present invention, only the vertical edges of the horizontal mask and the horizontal edges of the vertical mask are biased outwardly (i.e., shielded). This step corresponds to the shielding step in the process. As a result, the contribution of the "wrong" exposure to the aerial image is decreased. FIGS. 9a and 9b illustrate the horizontal mask having its vertical edges shield and the vertical mask having its horizontal edges shielded, respectively. Referring to FIGS. 10a and 10b, after applying the shielding, the sum of the two exposures drops below the threshold intensity at some positions so as to allow for printing of the features.

It is also noted that in FIGS. 7a, 7b, 9a, 9b, 11a and 11b, the shielding is illustrated as being applied uniformly to each edge of the feature. While such a uniform application is one possibility, it is also possible for each given edge to be treated as individual segments and have shielding applied (or not) on a segment by segment basis. For example, a given feature edge could be separated into individual segments ranging in length, for example, from 20-500 nm, with each segment be considered and treated as an individual edge.

Figures 11A, 11B:
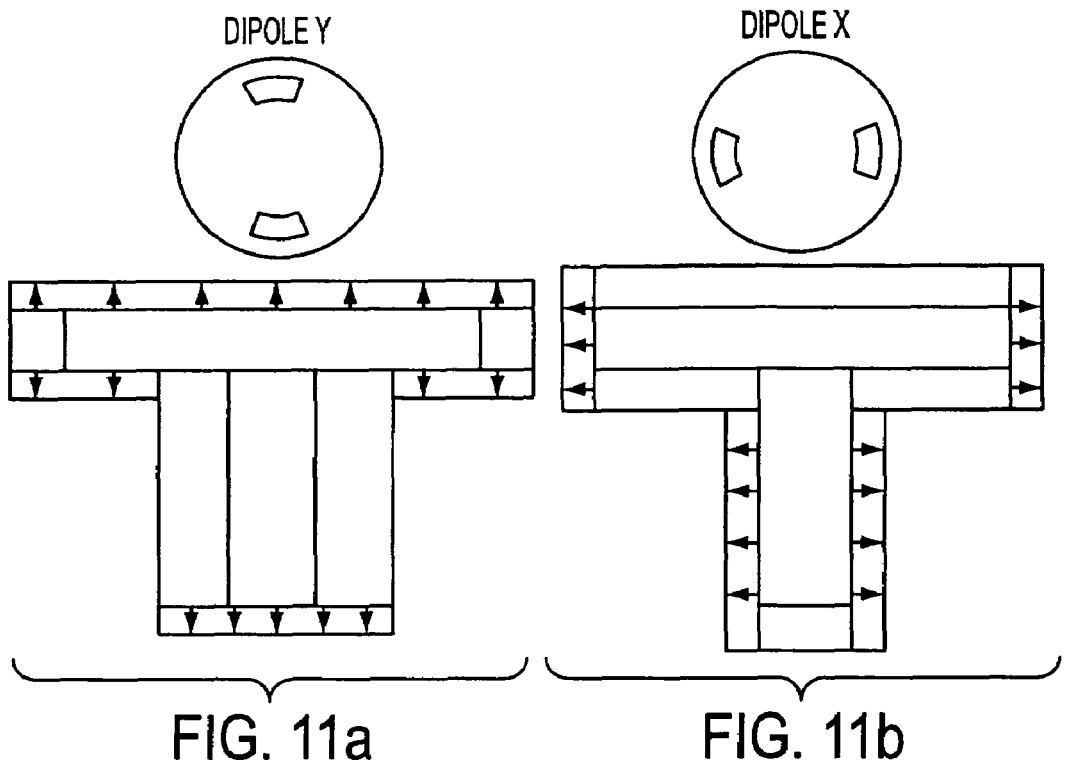
FIGS. 11a and 11b illustrate the further modification of the horizontal and vertical mask so as to provide for fine feature biasing.
Figures 12A, 12B:
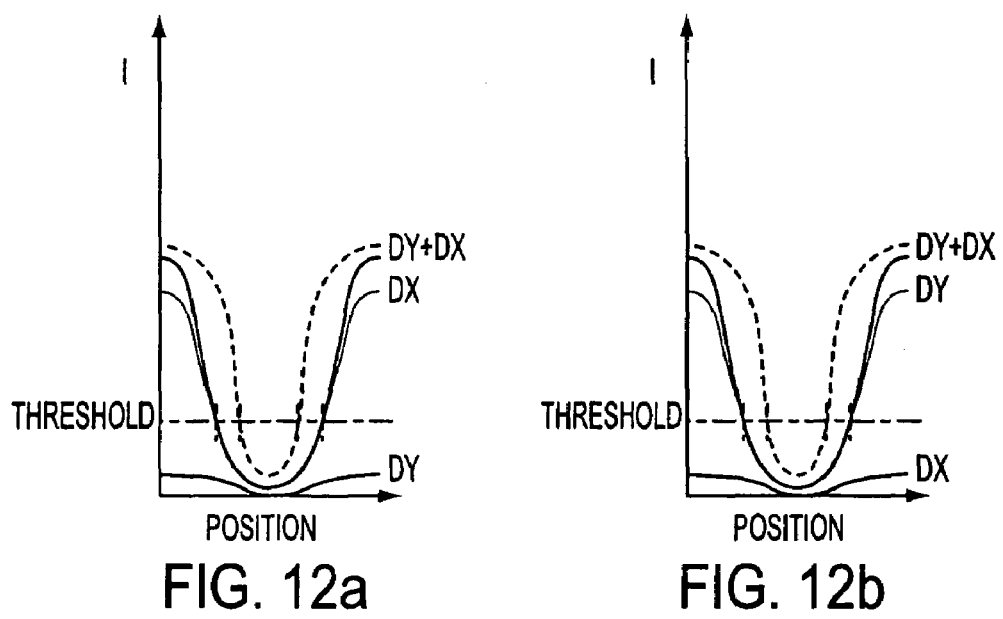
FIGS. 12a and 12b illustrate exemplary intensity distributions corresponding to the masks illustrated in FIGS. 11a and 11b.

FIGS. 11a and 11b illustrate the further modification of the horizontal and vertical mask so as to provide for fine feature biasing. The position interval over which the intensity drops below the threshold is the line width at the cut line. After the shielding step is performed, the line width is typically not equal to the targeted line width. The fine feature biasing step is utilized to correct for these offsets. As shown in FIGS. 11a and 11b, the horizontal edges of the features in the horizontal mask and the vertical edges of the features in the vertical mask are adjusted such that the line width of the predicted line is the same as the line width of the targeted line at the given location. FIGS. 12a and 12b illustrate the intensity distributions at the cut lines as performing the fine feature biasing step.

It is noted that variations of the method disclosed above are also possible. For example, the model-based placement of shielding structures is not limited to just double dipole lithography. Multiple exposure lithography can use a variety of illuminators, such as quasar, annular, hexapole and soft dipole (i.e., dipole plus a central spot). Shielding is often a requirement of multiple exposure lithography. Thus, the model-based shielding technique of the present invention can also be utilized for all variations of multiple exposure technologies requiring shielding.

In addition, the order of the process of the present invention is not limited to the specific order illustrated in FIG. 3. For example, it is also possible for the application of the SBs (Step 34) to be performed prior to the application of the shielding (Step 32).

It is further noted that the foregoing method of the present invention can be incorporated into a CAD (computer-aided design) programs, such as discussed above, which would function in-part to perform the foregoing method and generate files representing the horizontal and vertical masks produced by the process of the present invention.

The present invention also provides significant advantages over the prior art. Most importantly, instead of using a complicated hand-crafted rule-based decomposition flow, the method of the present invention allows for a simplified model-based procedure for generating the horizontal and vertical masks from the target design.

Figure 2:
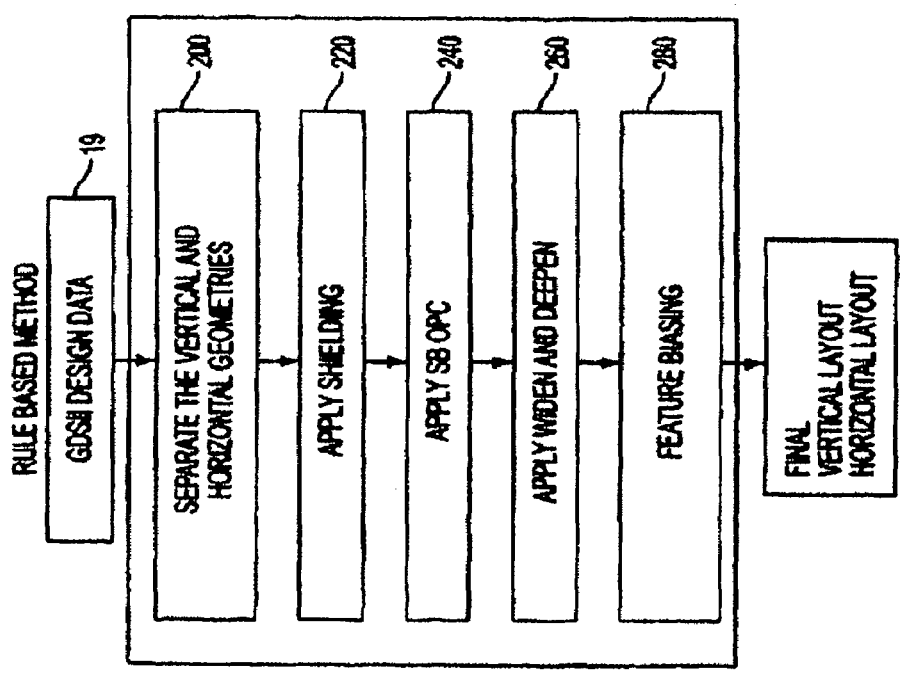
FIG. 2 illustrates an exemplary flowchart of a rule-based decomposition method for generating horizontal and vertical masks for use with double dipole illumination.

Further, the method of the present invention not only simplifies the processing flow, but it also helps to eliminate several significant problems associated with known techniques. For example, in comparison to the present invention, the known rule-based method illustrated in FIG. 2 requires the generation of a dedicated rule for each and every kind of feature to be printed. Thus, for any practical design, the set of rules that must be generated is prohibitively large. In contrast, with the method of the present invention, there is no need to build a library of rules. The table illustrated in FIG. 13 lists some of the differences between the method of the present invention and the known rule-based method.

In addition, the model-based approach of the present invention also provides shielding treatment, which more effectively handles difficult structures, such as, jogs, S-turns and U-turns. Further, the method of the present invention is capable of simultaneously converting complex logic and memory mask patterns in double dipole lithography (DDL) compatible mask layouts.

Figure 14:
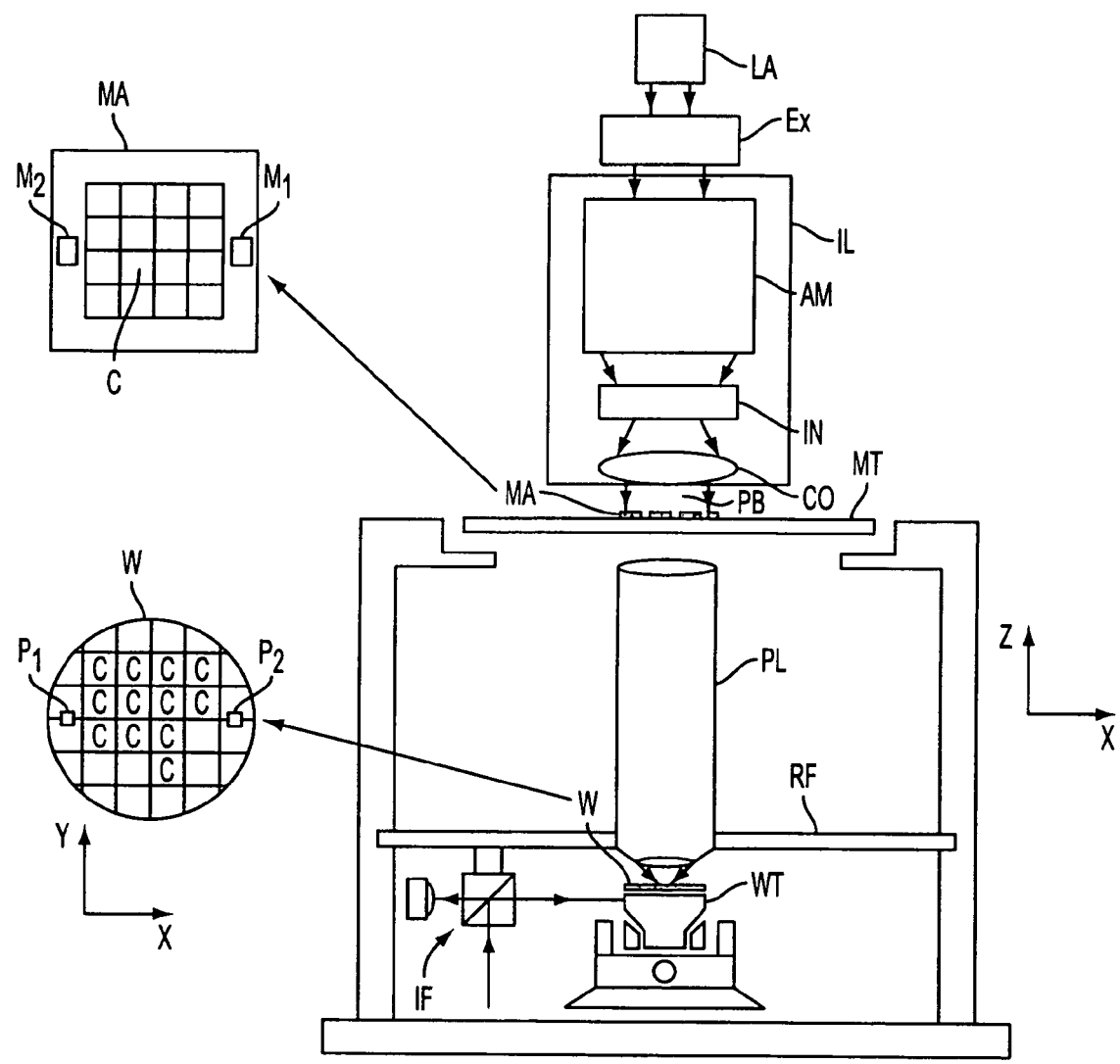
FIG. 14 schematically depicts a lithographic projection apparatus suitable for use with the masks designed with the aid of the current invention.

FIG. 14 schematically depicts a lithographic projection apparatus suitable for use with the masks designed with the aid of the current invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp, excimer laser or plasma discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 14 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 14. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although certain specific embodiments of the present invention have been disclosed, it is noted that the present invention may be embodied in other forms without departing from the spirit or essential characteristics thereof. For example, the method of the present invention can be utilized with all pole angles and sigma settings, and is not intended to be limited to the pole angles and sigma settings set forth and illustrated in the exemplary embodiments herein. The present embodiments are therefore to be considered in all respects as illustrative and not restrictive, the scope of the invention being indicated by the appended claims, and all changes that come within the meaning and range of equivalency of the claims are therefore intended to be embraced therein.

We Claim:

1. A method for printing a pattern on a substrate utilizing dipole illumination, said pattern being intended to be an accurate reproduction of a design comprising a target pattern having a plurality of features comprising horizontal and vertical edges, said method comprising the steps of:

generating a horizontal mask based on said target pattern, generating a vertical mask based on said target pattern, and performing a shielding step in which at least one of the vertical edges of the plurality of features in the target pattern is treated with a shield in the horizontal mask, and in which at least one of the horizontal edges of the plurality of features in the target pattern is treated with a shield in the vertical mask, said shields having dimensions that are determined based on a predicted image of the corresponding features in the target pattern.

2. The method for printing a pattern according to claim 1, further comprising:

performing an assist feature placement step in which sub-resolution assist features are disposed parallel to at least one of the horizontal edges of the plurality of features in the horizontal mask, and are disposed parallel to at least one of the vertical edges of the plurality of features in the vertical mask, and performing a feature biasing step in which at least one of the horizontal edges of the plurality of features in the horizontal mask are adjusted such that the resulting feature accurately reproduces the target pattern, and at least one of the vertical edges of the plurality of features in the vertical mask are adjusted such that the resulting feature accurately reproduces the target pattern.

3. The method for printing a pattern according to claim 2, wherein said assist feature placement step is performed prior to said shielding step.

4. The method for printing a pattern according to claim 1, wherein prior to said shielding step said horizontal mask and said vertical mask are identical to said pattern.

5. The method for printing a pattern according to claim 1, further comprising the steps of:

defining a system pseudo-intensity function, said system pseudo-intensity function approximating the imaging performance of said dipole illumination process, and determining the amount of shielding to be applied in said shielding step by evaluating said system pseudo-intensity function utilizing said target pattern.

6. The method for printing a pattern according to claim 5, wherein said system pseudo-intensity function is determined utilizing one of a calibrated model of the dipole illumination process or a theoretical model of the dipole illumination process.

7. The method for printing a pattern according to claim 1, further comprising:

generating a model defining the imaging performance of said dipole illumination process, wherein the simulated image used in said shielding step is determined utilizing said model and said target pattern.

8. The method for printing a pattern according to claim 1, further comprising:

segmenting the at least one vertical edge into a plurality of vertical segments;

determining the dimensions of the corresponding shield in the horizontal mask for each respective vertical segment;

segmenting the at least one horizontal edge into a plurality of horizontal segments; and determining the dimensions of the corresponding shield in the vertical mask for each respective horizontal segment.

9. The method for printing a pattern according to claim 1, wherein the shielding step includes:

determining not to apply a shield to at least another one of the vertical edges of the plurality of features in the target pattern in the horizontal mask; and determining not to apply a shield to at least another one of the horizontal edges of the plurality of features in the target pattern in the vertical mask, the determination being based on a predicted image of the corresponding features in the target pattern.

10. A method for printing a pattern on a substrate utilizing dipole illumination, said pattern being intended to be an accurate reproduction of a design comprising a target pattern having a plurality of features, said method comprising the steps of:

generating a first mask based on said target pattern, the first mask being adapted for a first pole of the dipole illumination;

generating a second mask based on said target pattern, the second mask being adapted for a second pole of the dipole illumination; and performing a shielding step in which at least a first one of the plurality of features in the target pattern is treated with a first shield in the first mask, the first feature having an edge which extends in a direction in the mask that is substantially orthogonal to the first pole, and in which at least a second one of the plurality of features in the target pattern is treated with a second shield in the second mask, the second feature having an edge which extends in a direction in the mask that is substantially orthogonal to the second pole, said first and second shields having dimensions that are determined based on a predicted image of the corresponding features in the target pattern.

11. The method for printing a pattern according to claim 10, further comprising:

performing an assist feature placement step in which sub-resolution assist features are disposed parallel to an edge of at least a third one of the plurality of features in the first mask, and are disposed parallel to an edge of at least a fourth one of the plurality of features in the second mask, and performing a feature biasing step in which an edge of at least a fifth one of the plurality of features in the first mask are adjusted such that the resulting feature accurately reproduces the target pattern, and an edge of at least a fifth one of the plurality of features in the second mask are adjusted such that the resulting feature accurately reproduces the target pattern.

12. The method for printing a pattern according to claim 11, wherein said assist feature placement step is performed prior to said shielding step.

13. The method for printing a pattern according to claim 10, wherein prior to said shielding step said first mask and said second mask are both identical to said pattern.

14. The method for printing a pattern according to claim 10, further comprising the steps of:
    defining a system pseudo-intensity function, said system pseudo-intensity function approximating the imaging performance of said dipole illumination process, and
    determining the amount of shielding to be applied in said shielding step by evaluating said system pseudo-intensity function utilizing said target pattern.

15. The method for printing a pattern according to claim 14, wherein said system pseudo-intensity function is determined utilizing one of a calibrated model of the dipole illumination process or a theoretical model of the dipole illumination process.

16. The method for printing a pattern according to claim 10, further comprising:
    generating a model defining the imaging performance of said dipole illumination process,
    wherein the simulated image used in said shielding step is determined utilizing said model and said target pattern.

17. The method for printing a pattern according to claim 10, further comprising:
    segmenting the first one of the features into a plurality of first segments;
    determining the dimensions of the corresponding first shield in the first mask for each respective first segment;
    segmenting the second one of the features into a plurality of second segments; and
    determining the dimensions of the corresponding second shield in the second mask for each respective second segment.

18. The method for printing a pattern according to claim 10, wherein the shielding step includes:
    determining not to apply a shield to at least a first different one of the plurality of features in the target pattern in the first mask; and
    determining not to apply a shield to at least a second different one of the plurality of features in the target pattern in the second mask,
    the determination being based on a predicted image of the corresponding features in the target pattern.

* * * * *